United States Patent [19]

Roosen et al.

[11] Patent Number: 5,013,138
[45] Date of Patent: May 7, 1991

[54] LIQUID CRYSTAL DISPLAY

[75] Inventors: Raymond A. Roosen, 's-Gravenwezel; Marcellus H. de Meyer, Edegem; Marcel J. Monbaliu, Mortsel, all of Belgium

[73] Assignee: AGFA-Gevaert N.V., Mortsel, Belgium

[21] Appl. No.: 299,455

[22] Filed: Jan. 23, 1989

Related U.S. Application Data

[62] Division of Ser. No. 143,377, Jan. 13, 1988, Pat. No. 4,830,941.

[30] Foreign Application Priority Data

Jan. 27, 1987 [EP] European Pat. Off. ........ 87200118.5

[51] Int. Cl.$^5$ .................... G02F 1/133; G02F 9/00; G02B 5/22
[52] U.S. Cl. ................. 350/339 F; 350/317; 350/350 R; 430/7
[58] Field of Search ............... 350/339 F, 339 R, 317; 430/7

[56] References Cited

U.S. PATENT DOCUMENTS

| | | | |
|---|---|---|---|
| 4,271,246 | 6/1981 | Sato et al. | 430/7 |
| 4,294,900 | 10/1981 | Aono | 430/7 |
| 4,632,514 | 12/1986 | Ogawa et al. | 350/339 F |
| 4,780,403 | 10/1988 | Kishimoto et al. | 430/393 X |
| 4,808,501 | 2/1989 | Chiulli | 430/7 |

*Primary Examiner*—Stanley D. Miller
*Assistant Examiner*—Anita Pellman Gross
*Attorney, Agent, or Firm*—William J. Daniel

[57] ABSTRACT

In a liquid crystal display wherein a liquid crystal material is contained in a gap defined between two surfaces, at least one of the said facing surfaces of the gap is constructed by a multi-color relief layer obtained by the color-development of a single hydrophilic colloid silver halide emulsion layer. The relief layer has different regions of multiple different thicknesses corresponding to the plurality of colors thereof, the thickness of each such relief region being characteristic of the particular color of that region. Each different relief region contains a dye of the corresponding color derived from a color coupling agent by the color development and a diffusion-resistant colorless compound derived from a colorless coupling agent by said color development. The colorless compound is present in each relief region in an amount which is different from that in each other relief region and is characteristic of that region. The different thicknesses of the relief layer are so determined in relation to the wave lengths of the corresponding colors that an improvement in visual contrast between electrically energized and electrically non-energized regions of the display is obtained.

4 Claims, 2 Drawing Sheets

LIQUID CRYSTAL DISPLAY

This is a division of Ser. No. 143,377, filed Jan. 13, 1988, U.S. Pat. No. 4,830,941.

FIELD OF THE INVENTION

The present invention relates to a process for the manufacture of a relief element having protruding portions of varying thickness produced by silver halide photochemistry.

BACKGROUND OF THE INVENTION

The photographic production of relief images in a hydrophilic colloid layer is known from the graphic art field where relief images serve as photoresist in the manufacture of graphic art copies or in the production of a printing plate.

Relief images serving as photoresist or mask image are produced in a common way by wash-off processing resulting in a selective removal of unhardened hydrophilic colloid layer portions as described e.g. in European Patent Specification No. 0 036 221.

The relief images produced by wash-off processing have a discontinuous character in that the relief is formed by selective removal of the imaging layer leaving residual relief portions that all have the same thickness.

In some applications it is desirable to have a relief element containing protruding portions of different thickness carry out to pattern-wise control e.g. using electrical and or optical properties.

One of these applications is the control of electro-optical properties of multi-colour liquid crystal display panels by varying the gap-width of the liquid crystal layer as a function of each colour to be displayed. A multi-colour liquid crystal display panel with varying gap-width is represented by cross-sectional view in FIG. 1 of the article "Full-Color Multi-Gap LC-TV Display Panel Addressed by a-Si TFTs" by Sadayoshi Hotta et al., in SID 86 Digest (1986) p. 296–297.

A survey of liquid crystal (LC) materials and device developments is given in IEEE Spectrum, Nov. 1972, p. 25–29, in Electronic Engineering, Aug. 1974, p. 30–37 and in OEP, Feb. 1985 under the title: "Liquid Crystal Gets Second Look As a Promising Display Medium", p. 42–47. From the last mentioned article and the contents of the article "Multiplexed Liquid Crystal Matrix Displays" by J. Duchene in the periodical "Displays, Jan. 1986, p. 3–11 can be learned that the twisted nematic (TN) liquid crystal displays (LCDs) are the most promising candidates for the production of flat panel multi-colour displays comparable in image quality with multi-colour cathode ray tubes.

The operating principles of a TN-liquid crystal display are illustrated in FIG. 10 of IEEE Spectrum, Nov. 1972, p. 29. A cross section of a multi-colour TN-LCD operating with electrode pixels covered with colour filter elements is given in FIG. 2(a) of IEEE Transactions on Electronic Devices, Vol. ED-30, No. 5, May 1983, p. 503.

One of the problems encountered with said TN-LCDs is their optical behaviour in the "off" state wherein their light transmission between parallel polarizers has to be zero or very small to obtain sufficient contrast between the "on" and "off" states of the picture elements (pixels).

As explained in the last mentioned reference and in IEEE Transactions on Electronic Devices, Vol. ED-30, No. 5, May 1983, FIG. 4, the transmittance of a TN-cell with parallel polarizers at the "off" state is a function of $\Delta n \cdot d / \lambda$, wherein $\Delta n$ represents a value for optical anisotropy (birefringence) corresponding with the difference of the refraction indices of the LC along perpendicular optical axes of maximum and minimum refraction, "d" represents the cell gap and $\lambda$ represents the wavelength.

From said FIG. 4 being reproduced here in the set of accompanying drawings as FIG. 1, one observed that for particular ratios of $\Delta n \cdot d / \lambda$ the transmittance (% T) is zero, which means that for each different colour wavelength, e.g. red (R), green (G) or blue (B), a different gap-width (d) applies for which there is minimum transmittance. For example, a practically satisfied gap-width condition for green light (wavelength 550 nm) obtained by experiment is 1.4 $\mu$m. Taking into account the fact that each display cell is filled with the same LC compound or mixture of LC compounds, the $\Delta n$ value for each display cell is a fixed value so that for full light extinction in the already mentioned "off" state, longer wavelengths, e.g. red light, require a broader gap width and smaller wavelengths, e.g. blue light, require a smaller gap-width.

As can be learned from FIG. 2(a) of IEEE Transactions on Electronic Devices, Vol. ED-30, No. 5, May 1983, p. 503 a full-colour image is produced by applying filter elements, red (R), green (G) and blue (B) for each picture element (pixel) in correspondence with energizable electrodes or electrode segments. The liquid crystal arranged in a gap between a pair of electrode elements acts as a light valve in TN-LCDs in such a way that the twisted nematic crystals in the electrically non-energized state of the electrode elements block the light passing through the filter element in correspondence with said elements and, conversely, allow light to pass through a filter element in correspondence with a pair of energized electrode elements.

A method for the production of a multicolour optical filter for use as a faceplate of a television camera tube by chromogenic development of a photographic silver halide emulsion layer is described in U.S. Pat. No. 4,271,246.

Although the present invention is primarily intended for the production of a multi-colour filter relief element suited for application in liquid crystal displays, other applications are possible.

For example, according to an application not necessarily related to multi-colour liquid crystal devices, thin transparent layers having a relief structure can be used for the production of interference patterns that may serve e.g. as hologram or colour display based on the phenomenon of destructive light interference.

Where a transparent relief layer is present on a reflective support, if the thickness of the relief regions of such layer is properly selected relative to the wavelength of monochromatic viewing light or the thickness(s) of one or more regions thereof in relation to the wavelength(s) of one or more spectral regions of polychromatic light, according to well-known optical principles, then advantage can be taken of the effects of destructive interference to create desirable light patterns. For the description of the principles of destructive interference reference is made to the book "University Physics" of Francis Weston Sears and Mark W. Zemansky - Addison -

Wesley Publishing Company, Reading Mass., 4th ed., (1972), p. 600–602.

OBJECTS OF THE INVENTION

It is an object of the present invention to provide a process for the manufacture of a relief element having pattern-wise protruding relief portions of different thickness.

It is a particular object of the present invention to provide a process for the manufacture of a single layer relief element with multiple thicknesses including in conjunction with its relief pattern a multi-colour pattern suited for use in a multi-colour liquid crystal display panel.

It is a further object of the present invention to provide a relief element having in a single supported hydrophilic colloid layer protruding relief portions of different thickness.

It is a further object of the present invention to provide a single layer relief element having coloured portions of different thickness suited for use in a liquid crystal display.

It is still further an object of the present invention to provide a liquid crystal display including a multi-colour filter relief element improving visual contrast between "on" and "off" state pixels of the display.

Other objects and advantages of the present invention will appear from the further description and drawings including FIGS. 1 to 4.

SUMMARY OF THE INVENTION

In accordance with the present invention a process for the manufacture of a relief element is provided which process comprises the steps of:

(I) pattern-wise photo-exposing a photographic silver halide emulsion material comprising on a support a single gelatin containing silver halide emulsion layer to form a latent pattern of exposed silver halide, (II) developing the exposed silver halide emulsion layer with an aqueous solution containing at least one developing agent for said halide that is oxidized pattern-wise forming a silver pattern and reacting at least one colourless coupling agent with said pattern-wise oxidized developing agent to form a diffusion resistant colourless reaction product, thereby increasing pattern-wise the thickness of said single developed silver halide emulsion layer as a function of the applied exposure dose.

According to a first embodiment the photo-exposure proceeds through a continuous tone pattern, also called continuous tone mask, or proceeds with a scanning laser beam modulated to form a continuous tone pattern.

According to a second embodiment the photo-exposure proceeds through a line or screen dot pattern containing lines and/or screen dots of different optical density or proceeds with a scanning laser beam modulated to form lines and/or dots of different optical density.

According to a third embodiment in accordance with the present invention a process for the manufacture of a relief element is provided which process comprises the steps of:

(I) pattern-wise photo-exposing a photographic silver halide emulsion material comprising on a support a single gelatin containing silver halide emulsion layer to form a first latent pattern of exposed silver halide.

(II) developing the exposed silver halide emulsion layer with an aqueous solution containing at least one developing agent for said halide that is oxidized pattern-wise, forming a silver pattern and reacting at least one colourless coupling agent with said pattern-wise oxidized developing agent to form a diffusion resistant colourless reaction product pattern-wise so as to increase pattern-wise the thickness of said emulsion layer as a function of the exposure dose, (III) repeating step (I) but exposing the silver halide emulsion layer material in areas different from the areas exposed in said step (I), (IV) repeating step (II) but using said colourless coupling agent(s) in a concentration and/or treatment conditions, e.g. temperature and/or duration, different from those used in said step (II) to obtain emulsion layer areas having a thickness different from the areas treated as in step (II), optionally repeating the steps (III) and (IV) to form each time emulsion layer areas of another thickness, and (V) bleaching the formed silver and removing substantially all silver from the photographic material by fixing and rinsing.

In the formation of the last relief pattern the exposure of the photographic material may proceed uniformly in order to fog the residual still light-sensitive silver halide or may proceed by uniformly chemically fogging said silver halide before relief formation.

In some but not all of the development steps the colourless coupling agent can be omitted when a thickness-increase therefrom is not needed.

A preferred process for the manufacture of a multi-colour relief element according to the present invention comprises the steps of:

(I) pattern-wise photo-exposing a photographic silver halide emulsion material comprising on a support a single gelatin containing silver halide emulsion layer to form a first latent pattern of exposed silver halide, (II) treating the exposed silver halide emulsion layer with an aqueous solution containing a chromagenic colour coupler and at least one chromogenic developing agent that is oxidized pattern-wise and forms a silver pattern and a pattern of (a) dye(s) and allowing at least one colourless coupling agent to form a diffusion resistant colourless reaction product(s) by reaction with oxidized developing agent increasing thereby the thickness of said layer in the exposed portions, (III) repeating step (I) but exposing the silver halide emulsion layer material in areas different from the areas exposed in said step (I), (IV) repeating step (II) to form a pattern of (an) other dye(s) with different spectral absorption, optionally repeating the steps (III) and (IV) to form each time a different colour pattern in other previously non-exposed areas, and (V) bleaching the formed silver and removing substantially all silver from the photographic material by fixing and rinsing.

Figure 5:
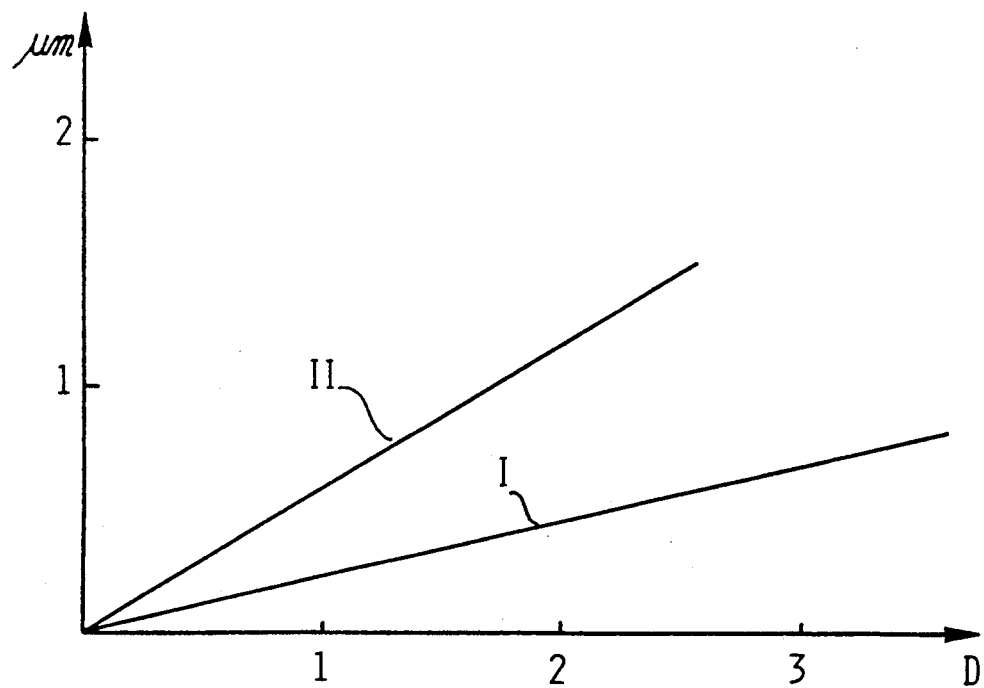

FIG. 5 relates to curves representing the change in thickness (expressed in microns) of a photographic layer versus its optical density (D) obtained with development respectively proceeding in the presence and absence respectively of a colourless coupling agent.

DETAILED DESCRIPTION OF ILLUSTRATIVE EMBODIMENTS

The colourless coupling agent is a colourless substance that according to techniques known in the photographic art of silver halide photography forms a colourless reaction product with oxidized developing agent. The colourless coupling agent may be applied from a developing bath and/or treating bath preceding and/or following the development of the exposed silver halide.

The mechanism of coupling reactions to colourless reactions products and representatives of such colourless coupling agents are discussed by W. Püschel in "Mitteilungen aus den Forschungslaboratorien der Agfa-Gevaert AG Leverkusen—München Band IV—Springer Verlag Berlin, Heidelberg and New York (1964) in the article "Zur Chemie der Weisskuppler".

Examples of colourless coupling agents are described in the German Offenlegungschrift (DE-OS) No. 1 909 067 and in the prior art mentioned therein.

Colourless coupling agents that are suited for use according to the present invention for the formation of diffusion resistant colourless compounds by coupling with oxidized p-phenylene diamine type colour developing agents correspond more particularly to the following general formula:

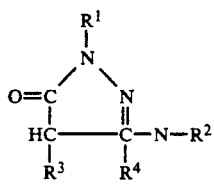

wherein:

$R^1$ and $R^2$ (same or different) represent a hydrocarbon group or a substituted hydrocarbon group, e.g. an alkyl group or an aryl group, preferably phenyl, or a —COR or a —SO$_2$R group, wherein R represents an alkyl group or an aryl or heterocyclic group optionally substituted with alkyl, fluoroalkyl, cyano, halogen, —OR$^{11}$, —SR$^{11}$, —COOR$^{11}$, —CONHR$^{11}$, —NH-COR$^{11}$, —NHSO$_2$R$^{11}$, —SO$_2$R$^{11}$ or —SO$_2$NHR$^{11}$ group wherein R$^{11}$ represents alkyl, aryl or a heterocyclic group, and R$^4$ is hydrogen or together with R$^2$ and the nitrogen atom linked therebetween represents the necessary atoms to close a heterocyclic ring, e.g. pyrrolidine, piperidine or morpholine ring, and $R^3$ represents a lower ($C_1$-$C_5$) alkyl group including said alkyl group in substituted form, e.g. methyl.

The terminology "diffusion resistant" is known from silver halide photochemistry and means that the compound in question is resistant to diffusion in hydrophilic colloid medium under wet alkaline conditions applied in the development of the silver halide to silver metal.

According to a particular embodiment the colourless coupling agent is present in the photographic material already before its exposure.

Representatives of colourless coupling agents according to the above general formula yielding particular good results when used according to the present invention are listed hereinafter in Table 1 followed by their preparation.

TABLE 1

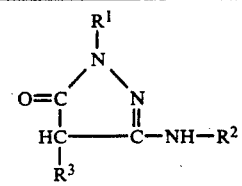

| Compound no. | $R^1$ | $R^2$ | $R^3$ |
|---|---|---|---|
| 1 | —⟨phenyl⟩ | —⟨phenyl⟩—Cl | —CH$_3$ |
| 2 | —⟨phenyl⟩ | —⟨phenyl⟩ | —CH$_3$ |
| 3 | —⟨phenyl⟩ | —⟨phenyl⟩ HNSO$_2$—⟨phenyl⟩—CH$_3$ | —CH$_3$ |

Preparation of Compound 1

The following ingredients were put in a high-pressure shaking autoclave:

| 3-(4-chloroanilino)-1-phenyl-5-pyrazolone | 43 g |
|---|---|
| ammonium acetate | 11.6 g |
| paraformaldehyde | 6.75 g |
| Raney-nickel | 7.56 g |
| methanol | 230 ml |

The autoclave was filled with hydrogen gas up to a pressure of 5250 kPa and heated to 120° C. At the moment the pressure dropped to 2800 kPa hydrogen was introduced again to reach a pressure of 5250 kPa.

After 2 h of shaking 0.15 mole of hydrogen were used in the reaction.

The catalyst was removed by filtering and the filtrate was cooled down to 0° C. The obtained crystalline precipitate was separated by suction filtering and dried.

Melting point: 199° C. Yield: 18.5 g.

Preparation of Compound 2

In a 1-liter three-necked flask, equipped with a sealed mechanical stirrer, reflux condenser, thermometer and inlet tube for nitrogen 500 ml of acetic acid were introduced and boiled for 30 min with reflux while introducing nitrogen to remove oxygen of the air.

94.5 g (0.5 mole) of 3-amino-1-phenyl-4-methyl-5-pyrazolone and 129.5 g (1 mole) of aniline hydrochloride were introduced and boiling with reflux was continued for 5 h while nitrogen was bubbled through.

To the still hot reaction mixture 1 liter of 1N hydrochloric acid was added at 55° C. whereby dissolution of solid material was obtained.

After the addition of 1 liter of water an oily layer was formed which solidified later on. The solid material was crushed in a mortar and stirred in water. The remaining solid material was separated by suction filtering and 500 ml of 2N aqueous sodium hydroxide were added thereto.

The alkaline solution was extracted with dichloromethane (4×200 ml). After neutralization with acetic acid a sticky residue was obtained that solidified on washing. The dried porduct was crystallized from 750 ml of ethyl acetate.

Melting point: 169° C. Yield: 80 g.

Preparation of Compound 3

A mixture of 26.6 g of 1-phenyl-3-hydroxy-4-methylpyrazolone, 26.2 g of N-p-tolusulfonyl-m-diamino-benzene and 1 ml of monomethylsulfate in 60 ml of xylene were heated for 20 h at reflux temperature while removing the water produced in the reaction by distillation using a Dean & Stark apparatus. The precipitate formed on cooling was separated by filtering and crystallized from 1,2-dichloroethane.

Yield: 10.5 g. Melting point: 183° C.

The present invention includes a relief element constituted by a supported and developed single hydrophilic colloid silver halide emulsion layer wherein protruding relief portions of different thickness include different amounts of diffusion resistant colourless compounds that are formed with at least one competing colorless coupling agent by of the development of pattern-wise exposed and/or fogged silver halide.

The present invention further includes a multi-colour relief element in one form of a supported and developed single hydrophilic colloid silver halide emulsion layer wherein protruding relief portions of different thickness include different amounts of diffusion resistant colourless compounds that are formed with at least one colourless coupling agent by chromogenic development of pattern-wise exposed and/or fogged silver halide and the protruding relief portions of different thickness in said relief element each contain at least one different colored dye formed by said chromogenic development, the dye color being characteristic of a given thickness in the relief layer.

The production of the dyes proceeds according to techniques known in the photographic art of silver halide type colour photography wherein dye forming substances are applied from a developing bath and/or treating bath preceding and/or following the development of the exposed silver halide.

Embodiments of colour photographic systems operating with colour forming ingredients applied by a liquid treatment to an image-wise exposed photographic silver halide emulsion material are described e.g. by Ralph M. Evans, T. W. Hanson and W. Lyle Brewer in the book "Principles of Color Photography"—New York—John Wiley and Sons, Inc. (1953) p. 257 to 265. The principles and practical embodiments of colour development of exposed silver halide emulsion materials are described also by P. Glafkidès in the book "Photographic Chemistry"—Vol. 2, Fountain Press—London (1960) p. 593–642.

A colour liquid crystal display using a twisted nematic (TN) mode liquid crystal layer combined with colour filter elements, red, green and blue, wherein the thickness of these elements is different is described in U.S. Pat. No. 4,632,514.

In an embodiment for the production of a coloured filter relief element according to the present invention, the above defined step (II) can include the treating of the exposed silver halide emulsion layer with an aqueous solution containing (1) a chromogenic developing agent for the exposed silver halide, (2) a colourless coupling agent to form with the oxidized developing agent a colourless diffusion resistant substance that increases the thickness of said emulsion layer and (3) at least one chromogenic coupling agent to form with the oxidized developing agent a colored dye.

Chromogenic development wherein the dye forming substances are supplied to the photographic material from an alkaline aqueous developer solution is the in a photographic colour process known as KODACHROME (trade name). The principles and details of said process are described e.g. by P. Glafkidès in the already mentioned book "Photographic Chemistry'—Vol. 2—Fountain Press—(1960), p. 626–627, and by R. A. J. Roosen, K. G. M. Staes and R. G. L. Verbrugghe in the book "Color: Theory and Imaging Systems"—Society of Photographic Scientists and Engineers 1330 Massachusetts Avenue, N.W. Washington, D.C. (1973), p. 232–233 and 235.

The KODACHROME (trade name) process operates with three superposed differently spectrally sensitized silver halide emulsion layers which after a one-shot image-wise exposure, single black-and-white development and successive coloured light exposures corresponding with the spectral sensitization followed each by a proper colour processing yield a positive colour image in each of said superposed layers forming thereby a multi-colour image according to the principles of subtractive colour image formation.

In a particular interesting embodiment according to the present invention a multi-colour filter relief element comprises line or mosaic type areas in at least two different colours, e.g. the three primary colours red, green and blue. Such relief filter element is suited for use in a liquid crystal display.

A patterned multi-colour relief filter element containing separate blue, green and red areas can be formed according to the present invention with a photographic material containing a single supported silver halide emulsion layer in a process containing the following steps:

(1) first the silver halide emulsion layer is exposed to a light pattern having one of the colours blue, green or red, (2) the exposed silver halide emulsion layer is then developed in a developer comprising a colourless coupling agent, a chromogenic developing agent and a first chromogenic coupling agent so as to form in the exposed areas a blue, green or red dye together with image silver and to leave in the non-exposed areas of the photographic material still photosensitive silver halide, (3) after completing the first development the silver halide emulsion layer is washed to remove the developer.

(4) the above exposure, development and washing are repeated twice, each time developing other areas still containing photosensitive silver halide to finally obtain in one single layer a multi-colour patterned filter relief element comprising separate blue, green and red areas of different thickness due to pattern-wise different concentrations of diffusion resistant colourless reaction product obtained by a coupling reaction of oxidized developing agent with said colourless coupling agent, and (5) after washing the silver halide emulsion layer following the last colour development step all silver is bleached and removed by fixing and washing.

According to a modified embodiment the last exposure step in each of the above embodiments can be an overall exposure for fogging the remaining light-sensitive silver halide. Alternatively the overall exposure can be replaced by a chemical fogging step on applying fogging agent(s) for silver halide.

Suitable fogging agents are e.g. hydrazine sulphate, thiourea, allyl-thiourea, triethylamino-borane, sodium stannite and reductones.

The relief differences can be obtained by using a single colourless coupling agent or mixture thereof.

The colour formed in each chromogenic development can be obtained by using a single chromogenic colour coupler in each chromogenic development or a mixture of different colour couplers. For example, the formation of a blue coloured area proceeds by using a colour coupler that produces a monochromatic blue dye or by a mixture of colour couplers wherein one coupler produces a cyan dye and an other coupler a magenta dye. These dyes absorb respectively red and green light so that only blue light is transmitted or reflected.

According to a preferred embodiment intermixing of dyes formed in the differently chromogenically developed area is prevented by having each chromogenic development steps followed by a black-and-white full scale development (developing-out development) in order to insure that no exposed and developable silver halide is still available in an area that just before had been subjected to one of the chromogenic developments. Operating that way spectrally very pure colours in the differently coloured areas can be obtained.

According to a convenient exposure method for the production of multi-colour filter relief patterns the exposures are made pattern-wise through a mask having apertures corresponding with the areas to be exposed. The exposure may be a contact exposure or a projection exposure using a lens type system for focusing purposes. In an alternative of use is made of a modulated laser beam.

According to a first embodiment the same mask with square size apertures is used for all the exposures but after each chromogenic development the mask is moved before the following exposure within a distance corresponding with the length of the side of the square aperture plus the optional width of an interspace so that in the successive chromogenic developments adjacent differently coloured square sized areas of different thickness are formed.

According to a second embodiment for each exposure a different mask is used and the different exposures are carried out in register with respect to the photographic material to obtain with the different exposures a desired pattern of differently coloured areas directly adjacent to each other or separated by a more or less wide interspace.

In chromogenic development based on a coupling reaction of an oxidized p-phenylene diamine type developing agent yellow to orange dyes are formed usually with couplers containing an open-chain active methylene group. Couplers that contain the active methylene group in a heterocyclic ring, e.g. pyrazolone ring, form magenta dyes and those that contain an active methine group (e.g. in the para-position of a phenol or naphthol) generally form cyan dyes. The dyes formed by said coupling belong to the class of azomethine (yellow and magenta) or indoaniline (cyan) dyes.

Especially useful chromogenic developing agents are listed in the following Table 2.

TABLE 2

| No. | Structural formula |
|---|---|
| 1. | $H_2N-\phenyl-N(C_2H_5)_2$ |
| 2. | $H_2N-\phenyl(CH_3)-N(C_2H_5)_2$ |
| 3. | $H_2N-\phenyl(CH_3)-N(C_2H_5)(C_2H_4.NH.SO_2.CH_3)$ |
| 4. | $H_2N-\phenyl(CH_3)-N(C_2H_5)(C_2H_4.OH)$ |

Especially useful chromogenic coupling agents also called couplers for the production of azomethine or indoaniline dyes are listed in the following Table 3.

TABLE 3

| No. | Structural formula |
|---|---|
| Yellow | |
| 1. | $H_3C-\phenyl-SO_2-NH-\phenyl-NH-CO-CH_2-CO-\phenyl$ |
| 2. | $\phenyl-CO-CH_2-CO-NH-\phenyl(OCH_3)$ |

TABLE 3-continued
| No. | Structural formula |
|---|---|
| 3. | 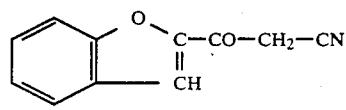 |
| 4. | 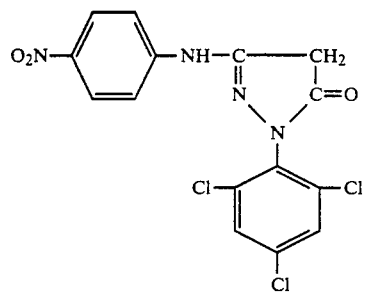 |
| 5. | 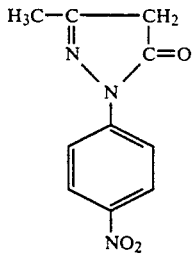 |
Magenta
| 6. | 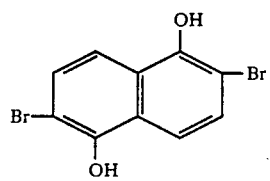 |
|---|---|
| 7. | 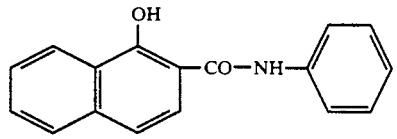 |
| 8. | |
Cyan
| 9. | |
|---|---|
| 10. | |

TABLE 3-continued

| No. | Structural formula |
| --- | --- |
| 11. | 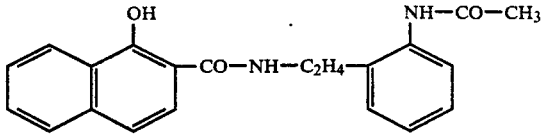 |
| 12. | 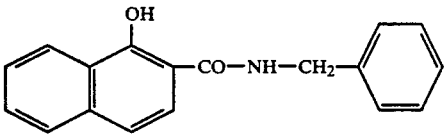 |

Other chromogenic coupling reactions with an oxidized developing agent result in the formation of indamine, indophenol dyes, azine, amidrazone or azo dyes as described e.g. in the book "The Theory of the Photographic Process" 4th ed. edited by T. H. James—Macmillan Publishing Co., Inc. New York, (1977) p. 337-339 and in U.S. Pat. Nos. 4,004,926 and 4,514,494.

In the single silver halide emulsion layer of use according to the present invention the silver halide may be of any type as used in the production of negative working silver halide emulsion layers. The silver halide may be silver chloride, silver chlorobromide, silver bromide, silver bromoiodide or silver chlorobromide-iodide.

The silver halide emulsion may be prepared according to techniques known to those skilled in the art, e.g. as described in Research Disclosure of Dec. 1978, item 17643.

The average grain size of the silver halide is chosen in view of the image resolution to be obtained. Preferred for high resolution work are Lippmann emulsions wherein the average grain size is at most 0.1 μm. Details about the preparation of Lippmann emulsions can be found in the book of P. Glafkidès—"Photographic Chemistry", Vol. 1—Fountain Press London (1958), p. 365-368. The Lippmann emulsions are advantageously prepared in the presence of silver halide grain growth restrainers, e.g. those described in U.S. Pat. Nos. 3,501,313, 3,661,592, 3,704,130, 3,825,426, 3,847,617 and 4,202,695 and also in the Research Disclosure No. 9401 of Product Licensing Index, Febr. 1972.

With Lippmann-type emulsion layers patterns with excellent acutance and resolving power suited for use in the manufacture or in combination with micro-electronic devices or elements are formed. The silver halide emulsion may comprise light-screening dyes, e.g. as described in U.S. Pat. No. 3,652,280 and in Belgian Patent (BE-P) No. 699,375.

The spectral sensitization of the silver halide, if thereto is a need, may proceed with spectral sensitizing dyes for silver halide known to those skilled in the art. The spectral sensitization of Lippmann emulsions may be carried out as described e.g. in published French Patent Application No. 2,028,720.

The silver halide emulsion layer for producing therein a relief pattern according to the present invention may be coated on a large variety of supports which includes opaque as well as transparent supports. For example, the silver halide emulsion layer may be applied on metal supports with high or low reflectivity to visible light. For producing a multi-colour patterned transmission relief filter the silver halide emulsion layer is applied preferably on a transparent resin support or glass support.

The adherence of a hydrophilic gelatin-containing silver halide emulsion layer to glass may be improved by the use of organic silicon compounds as described e.g. in U.S. Pat. No. 3,661,584.

The patterned relief element may be protected against mechanical or chemical damage by applying a protective coating or hardening the hydrophilic colloid of the developed silver halide emulsion layer with a hardening agent known to those skilled in the art for hardening proteinaceous colloids, e.g. a polyepoxy hardening agent as described in DE-OS No. 29 35 354.

Figure 1:
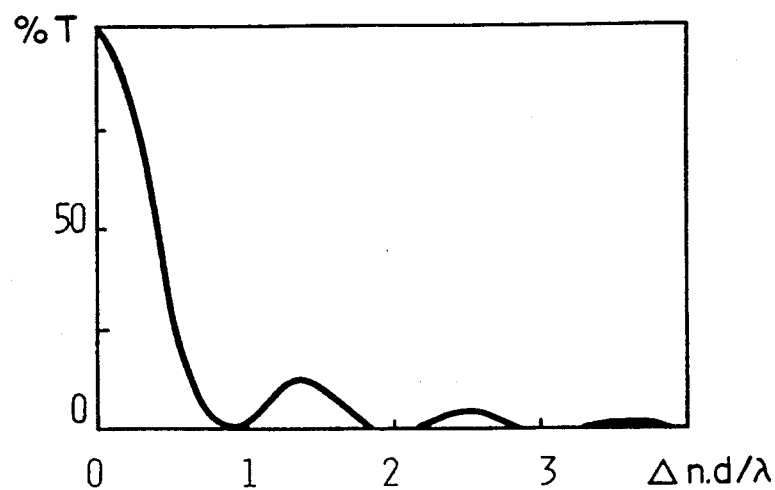
FIG. 1 represents a curve showing percentage of visible light transmission (% T) versus the already explained ratio $\Delta n \cdot d / \lambda$.
Figure 2:
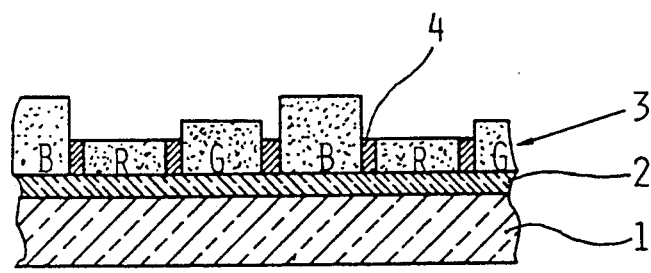
FIG. 2 represents a schematic cross-sectional view of a part of a multi-colour mosaic type filter relief element manufactured according to the present invention, taken generally along line 2—2' in FIG. 3.

FIG. 2 represents a schematic cross-sectional view of a part of a mosaic type multi-colour filter relief element manufactured according to the present invention. Herein element 1 represents a transparent glass base coated with a subbing layer 2 being covered with a silver halide emulsion layer 3 that has been subjected to the steps of the process defined above for producing a multi-colour relief pattern containing red spots R, green spots G and blue spots B separated by an opaque narrow fringe area 4. The opacity in said area may be obtained by colour development producing a black dye or mixtures of dyes forming black.

Figure 3:
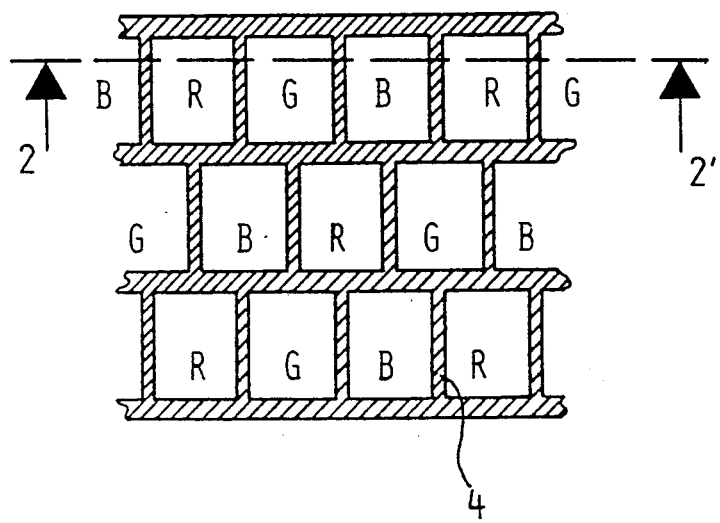
FIG. 3 is a plan view of such filter relief element comprising areas of rectangular shape for transmitting respectively red, green and blue light.

Said opaque fringe area 4 is clearly shown in the top view represented by FIG. 3, the sectional view represented in FIG. 2 being made along the dash line 2—2'.

A relief element according to the present invention containing a multi-colour filter pattern is particularly suited for use in liquid crystal imaging displays (LCDs).

A liquid crystal display according to the present invention contains a liquid crystal material in a gap, wherein at least one of the facing surfaces of the gap contains a multi-colour relief layer being a colour-developed single hydrophilic colloid silver halide emulsion layer wherein protruding relief portions of different thickness include different amounts of diffusion resistant colourless compound(s) that is (are) formed with at least one colourless coupling agent through the intermediary of the development of pattern-wise exposed or fogged silver halide and the protruding relief portions of different thickness in said relief element each have a different colour and contain (a) dye(s) also formed through the intermediary of said development, the thickness of the protruding relief portions in said filter layer being modulated in such a way that an improvement in visual contrast between electrically energized and electrically non-energized areas of the display is obtained.

Said liquid crystal display contains for multi-colour reproduction in conjunction with the colour areas of said multi-colour filter element electrode areas that can be pattern-wise electrically energized with pattern-wise modulated electrode driving in response to electrical signals. Said signals are stemming from e.g. electronic measuring devices, warning devices or from television broadcast emitters.

For full-colour reproduction capabilities the display contains a relief layer including a mosaic type pattern of red, green and blue areas respectively.

Figure 4:
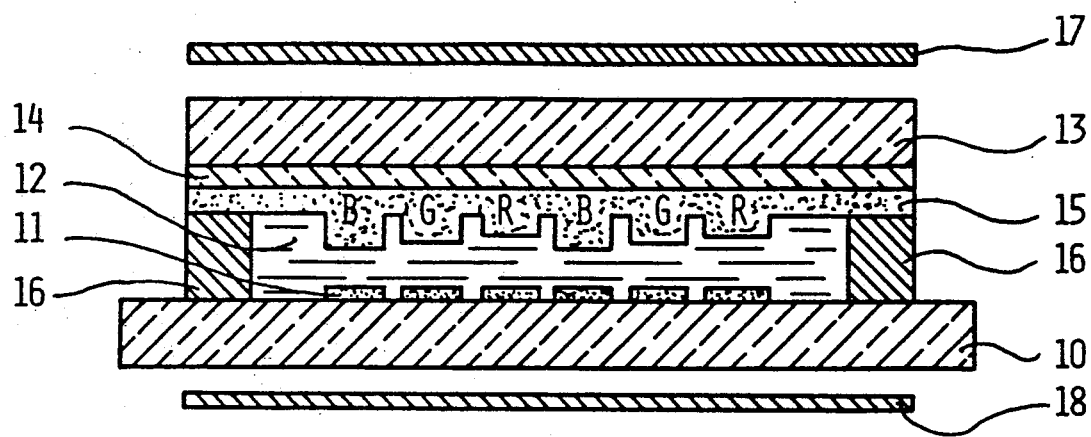
FIG. 4 represents a schematic cross-sectional view of a full-colour matrix liquid-crystal display including a multi-colour filter relief element according to the present invention.

FIG. 4 represents a liquid crystal panel with multi-colour filter relief element according to the present invention in which twisted nematic (TN) liquid crystals are used for full-colour reproduction.

In said panel a first glass plate 10 is coated with:

(1) a matrix of pixel electrodes 11 each individually connected with a polysilicon thin-film transistor (TFT not shown in the drawing), (2) a liquid crystal layer 12 of the twisted nematic type (TN), and a second glass plate 13 being coated at the side directed towards the first glass plate 10 with:

(i) a common continuous transparent electrode 14, e.g. made of vapour deposited indium tin oxide (ITO), (ii) a multi-colour filter relief element 15 produced according to the present invention containing red R, green G and blue B areas, opposite said pixel electrodes 11.

A spacer element 16 defines the overall gap-width and keeps the liquid crystals in the gap which has its broadest width in correspondence with the red filter areas, a smaller width in correspondence with the green filter areas and the smallest width in correspondence with the blue filter areas.

Polarizer layers 17 and 18 are arranged as outermost elements having their polarizing plane turned over the same angle whereby they operate the display in the so-called reverse contrast mode wherein the areas corresponding in "ON" state with energized electrode pixels transmit light and the areas corresponding in "OFF" state with non-energized electrode pixels block that light.

According to a modified embodiment in the display the common electrode layer 14 is arranged subjacent to the multi-colour filter relief element and follows its relief pattern. A display with common electrode subjacent the colour filter elements is illustrated in published EP-A No. 0 179 922.

According to a special embodiment of the present invention a liquid crystal display contains a liquid crystal material in a gap, wherein at least one of the facing surfaces of the gap contains a relief layer wherein protruding relief areas include an amount of diffusion resistant colourless compound(s) that is (are) formed with at least one colourless coupling agent through the intermediary of the development of pattern-wise exposed and/or fogged silver halide, the thickness of the protruding relief areas in said relief layer being the same and being such that when present on a reflective element it is possible to obtain monochrome light patterns by destructive interference of light having a ¼th wavelength dimension corresponding with the thickness of said areas of the relief layer, and wherein said display contains in conjunction with said relief areas electrode areas that can be pattern-wise electrically energized with pattern-wise modulated electrode driving in response to electrical signals.

According to a further special embodiment a liquid crystal display contains a liquid crystal material in a gap, wherein at least one of the facing surfaces of the gap contains a relief layer wherein protruding relief areas of different thickness include different amounts of diffusion resistant colourless compounds that are formed with at least one colourless coupling agent through the intermediary of the development of pattern-wise exposed and/or fogged silver halide, the thickness of the protruding relief areas in said relief layer being modulated in such a way that when said layer is present on a reflective element it is possible to obtain polychrome light patterns by destructive interference of light having a ¼th wavelength dimension corresponding with the thickness of said areas of the relief layer, and wherein said display contains said relief areas of different thickness in conjunction with electrode areas that can be pattern-wise electrically energized with pattern-wise modulated electrode driving in response to electrical signals.

The protruding relief areas obtained according to the present invention may serve in liquid crystal displays as spacer elements and/or rim elements to keep liquid crystal mass inside the display and facing layer structures apart at a certain gap distance.

In the following examples illustrating the invention all percentages and ratios are by weight unless mentioned otherwise.

EXAMPLE 1

Procedure A

A photographic gelatin-silver halide emulsion layer containing green-sensitized silver bromide-iodide (3 mole % iodide) grains of an average grain size of 0.05 um (precipitated by the double-jet technique in the presence of 13 mg of N,N'-dimethyl-dithio-oxamide per mole of silver halide) was coated at a silver halide coverage equivalent to 2.5 g of silver nitrate per m2 on a glass plate having a thickness of 1.5 mm and was in a first phase of multi-colour screen formation contact-exposed with green light through a screen having square size apertures of 0.2 mm × 0.2 mm. The apertures were in orthogonal directions interrupted by opaque screen parts having a length of 0.4 mm and a width of 0.2 mm.

The thus exposed layer was subjected to a first colour development using a colour developer having the following composition:

| | |
|---|---|
| $(NaPO_3)_6$ | 1 g |
| KBr | 1 g |
| KI (0.1% aqueous solution) | 10 ml |
| NaOH | 5 g |
| $Na_2SO_3$ (anhydrous) | 10 g |
| $Na_2HPO_4$ | 18 g |
| colour coupler for cyan No. 9 of Table 3 | 1.5 g |
| colour developer No. 3 of Table 1 | 3 g |
| water up to | 1000 ml |

The development was carried out for 2 minutes at 20° C. Thereupon the plate was rinsed with water.

Thereupon the developed silver metal was removed by bleaching and fixing using a bleaching bath having the following composition:

| | |
|---|---|
| KBr | 30 g |
| sodium acetate | 5 g |
| acetic acid (concentrated) | 4.8 ml |
| potassiumhexacyanoferrate (II) | 5 g |
| potassiumhexacyanoferrate (III) | 45 g |

-continued

| ethylenediamine tetra-acetic acid trisodium salt | 10 g |
| --- | --- |
| sodium-hydrogen sulphate | 5 g |
| water up to | 1000 ml | and a fixing bath having the following composition:

| sodium hydroxide | 4 g |
| --- | --- |
| sodiummetabisulphite ($Na_2S_2O_5$ anhydrous) | 9 g |
| acetic acid (concentrated) | 8 ml |
| ammonium thiosulphate | 100 g |
| water up to | 1000 ml |

Procedure B

The colour development step of Procedure A was repeated, but followed by a further development for 2 min at 20° C. with a developer containing a colourless coupling agent in the following liquid composition:

| $(NaPO_3)_6$ | 1 g |
| --- | --- |
| KBr | 1 g |
| KI (0.1% aqueous solution) | 10 ml |
| NaOH | 5 g |
| $Na_2SO_3$ (anhydrous) | 10 g |
| $Na_2HPO_4$ | 18 g |
| colourless coupling agent No. 1 of Table 1 | 1.5 g |
| colour developing agent No. 3 of Table 2 | 3 g |
| water up to | 1000 ml |

The development was carried out for 2 minutes at 20° C. Thereupon the plate was rinsed with water, bleached and fixed as in procedure A.

In both procedures A and B a blue dye with the same spectral characteristics was obtained in the exposed and developed areas.

The relief structure obtained by procedure A contained blue protruding portions having a thickness of 0.30 μm. The blue image portions of the relief structure obtained by procedure B had a thickness of 1.15 μm proving that the development with colourless coupling agent has substantially raised the thickness of the relief structure of the reproduced screen pattern. The measurement of the thickness of the relief portions was carried out with a PERTHOMETER type S6P (trade name of Feinprüf GmbH-Göttingen-W. Germany.)

EXAMPLE 2

The present Example 2 illustrates by FIG. 5 how by changing the light-exposure dose and/or the development time the spectral density of the dye developed portions and their thickness can be controlled and how the thickness of the developed photographic layer varies when effecting the development in the presence or absence respectively of colourless coupling agent. In the present Example 2 Procedure A of Example 1 was repeated with the difference that in a first set of experiments (I) increasing exposure doses were applied and the developer liquid was free of colourless coupling agent and in a second set of experiments (II) 1.5 g/l of the colourless coupling agent No. 1 of Table 1 was added to the developer composition of procedure A.

In FIG. 5 curves I and II relate respectively to the change in thickness (expressed in microns) of the photographic layer versus its optical density (D) at maximal spectral absorption of the blue dye portions obtained by experiments I and II respectively.

We claim:

1. A liquid crystal display wherein a liquid crystal material is contained in a gap defined between two facing surfaces, at least one of the said facing surfaces of the gap being constructed by a multi-colour relief layer obtained by the colour-development of a single hydrophilic colloid silver halide emulsion layer, said relief layer having different regions of multiple different thicknesses corresponding to the plurality of colours thereof, the thickness of each such relief region being characteristic of the particular colour of that region, each different relief region containing a dye of said corresponding colour derived from a colour coupling agent by said colour development and a diffusion-resistant colourless compound derived from a colourless coupling agent by said colour development, said colourless compound being present in each relief region in an amount which is different from that in each other relief region and is characteristic of that region, said thicknesses being so determined in relation to the wave length of the corresponding colour that an improvement in visual contrast between electrically energized and electrically non-energized regions of the display is obtained.

2. A liquid crystal display according to claim 1, wherein said display contains for multi-colour reproduction in conjunction with the coloured regions of said multi-colour relief layer electrode areas that can be pattern-wise electrically energized by means of a pattern-wise modulated electrode activated in response to electrical signals.

3. A liquid crystal display according to claim 1, wherein said display is adapted for full-colour reproduction and said relief layer comprises a mosaic type pattern of red, green and blue regions respectively.

4. The liquid crystal display of claim 1 wherein the difference in the amounts of such diffusion resistant colourless compound in said relief regions is generally proportional to the difference in the thicknesses thereof.

* * * * *